United States Patent
Merritt

(10) Patent No.: US 6,205,078 B1
(45) Date of Patent: Mar. 20, 2001

(54) METHOD AND APPARATUS FOR TRANSLATING SIGNALS

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/544,560

(22) Filed: Apr. 6, 2000

Related U.S. Application Data

(62) Division of application No. 09/459,980, filed on Dec. 14, 1999, which is a continuation of application No. 09/083,093, filed on May 22, 1998, now Pat. No. 6,052,325.

(51) Int. Cl.$^7$ .................................................. G11C 7/00
(52) U.S. Cl. ................ 365/226; 365/189.07; 365/189.09
(58) Field of Search .................................. 365/226, 207, 365/189.05, 189.07, 189.09; 327/52, 536

(56) References Cited

U.S. PATENT DOCUMENTS

| | | | |
|---|---|---|---|
| 4,937,476 | 6/1990 | Bazes | 307/475 |
| 4,943,743 | 7/1990 | Pelley, III et al. | 307/475 |
| 5,341,045 | 8/1994 | Almulla | 307/475 |
| 5,343,086 | 8/1994 | Fung et al. | 307/296.1 |
| 5,426,616 * | 6/1995 | Kajigaya et al. | 365/226 |
| 5,821,808 * | 10/1998 | Fujima | 327/541 |
| 5,822,267 * | 10/1998 | Watanabe et al. | 365/227 |
| 5,835,420 * | 11/1998 | Lee et al. | 365/189.09 |
| 5,852,376 * | 12/1998 | Kraus | 327/143 |
| 5,875,133 * | 2/1999 | Miyashita et al. | 365/189.09 |

\* cited by examiner

Primary Examiner—Vu A. Le
Assistant Examiner—Anh Phung
(74) Attorney, Agent, or Firm—Dickstein Shapiro Morin & Oshinsky LLP

(57) ABSTRACT

A method and apparatus for transmitting signals between electronic circuits having different power supplies. In one preferred embodiment, an input buffer is provided to a first circuit that uses a first power supply for receiving input signals from a second circuit that uses a second power supply. The input buffer translates the input signal from the second signal level used in the second circuit so as to be compatible with the first circuit. Also, in the preferred embodiment, the input buffer includes a reference voltage generator that generates the reference signal at a level corresponding to a logical threshold or "trip point" voltage level between the high and low voltage states of the second power supply. In particular, the voltage threshold is dynamically self-adjusted in proportion to the second power supply voltage level used in the second circuit.

12 Claims, 4 Drawing Sheets

METHOD AND APPARATUS FOR TRANSLATING SIGNALS

This application is a divisional of Ser. No. 09/459,980, filed Dec. 14, 1999, which is a continuation of 09/083,093 filed May 22, 1998, now U.S. Pat. No. 6,052,325, issued Apr. 18, 2000, the subject matter of which is incorporated by reference herein.

BACKGROUND OF THE INVENTION

1. Field of the Invention

The invention is directed to the field of signal translation between electronic circuits. More specifically, the invention is directed to the translation of information signals between electronic circuits which operate under different power supplies.

2. Description of Related Art

Modern computer systems typically include a variety of discrete electronic circuits. Although some effort is made to comply with established standards, circumstances often arise in which electronic circuits intended to be used together operate using different power supplies, often having different voltage ranges.

A common example of this is found when electronic circuits which are compatible with standard transistor-transistor-logic (TTL) interface with electronic circuitry which uses complementary metal oxide semiconductor (CMOS) devices. TTL devices often operate using a power supply rated at 3.3 volts, and contain logic levels (i.e., Boolean logic states representing "0" and "1") that require a signal level to be above a logical threshold (also known as a "trip point") of 1.4 volts to represent a logical "1" or a signal level below the trip point to represent a logical "0". CMOS devices, on the other hand, often operate using a power supply rated at 5.0 volts and require a signal level above a trip point of 2.5 volts to represent a logical "1" or a signal level below the trip point to represent a logical "0".

A similar problem exists when two core circuits operate under different power supplies on the same chip. For example, a single-chip graphics accelerator may include a basic logic section that operates under a power supply nominally rated at 1.8 volts, and a dynamic random access memory (DRAM) core section that operates under a different power supply nominally rated at 2.5 volts.

The problem that arises when different circuits operating with different power supplies interface with each other is that the threshold point (i.e., "trip point") in which a given signal is to be determined as being in one logical state or the other differs depending on the operating voltage of the power supply used. A TTL signal level of, for example, 2.0 volts is sufficient to trigger a logical "1", in a TTL receiving device. The same signal level, however, if received by a CMOS device would be detected as a logical "0," because the signal level would be below the 2.5 volt trip point of the CMOS device, thus creating an intolerable error in transmission between the TTL and CMOS devices.

Known attempts have been made to overcome this problem. Input buffers, for example, have been added to CMOS devices as an interface to receive input data signals from a TTL device and translate the input TTL signals into compatible CMOS output signals. Such an input buffer is able to differentiate between a received high and low TTL input signal by comparing the TTL input to a predetermined threshold value (i.e., trip point). The input signal is considered a high input if it has a voltage level greater than the trip point, and considered a low input if the voltage level is less than the trip point. The high/low states determined from this comparison can then be used to output signals which transition in a signal range which is compatible with downstream CMOS devices.

The predetermined threshold value or "trip point" is typically set by circuit designers to fall approximately midway between the expected high voltage levels (e.g., above 2.0 volts) and low voltage levels (e.g., below 0.8 volts) of the external circuitry (e.g., TTL) transmitting the input signals, as shown for example in U.S. Pat. No. 4,937,476. Such input buffers, however, are not able to take into account inherent variations in the trip points of different transmitting devices due to manufacturing tolerances and the like. For example, a typical power supply for a TTL device is nominally rated at 3.3 volts, but, in practice, may generate voltages anywhere from 2.8 volts to 3.7 volts during its operation and still be considered a rated 3.3 volt power supply. Any variation in the power supply level of the transmitting device will require a proportional change in the trip point used by the input buffer to properly translate the input signals.

Some input buffers, as described in U.S. Pat. No. 4,306,801, for example, although successful in translating signal levels from devices operating under different power supplies, suffer from propagation delay skew. This skew problem is exhibited when an input signal having a high-to-low (falling edge). transition is delayed through the input buffer much longer than that for an input signal having a low-to-high (rising edge) transition. The skew is attributed to the mobility difference between P-channel and N-channel semiconductor material that makes P-channel transistors inherently slower than N-channel transistors by a factor of 1.5 to 3.0. The complementary use of P-channel and N-channel transistors in these known input buffers can create a propagation delay skew.

The skew is also attributed to the fact that the trip point of the receiving circuit is closer to either the high or the low voltage state of the transmitting circuit. Where the high voltage state is closer to the trip point, for example, as shown in FIG. 4a, the falling edge transition time will be shorter than the rising edge transition time, thereby resulting in the skew problem.

SUMMARY OF THE INVENTION

The invention provides a method and apparatus for transmitting signals between electronic circuits having different power supplies. An input buffer is provided to a first circuit, which may use a first power supply, for receiving input signals from a second circuit, which may use a second power supply. The input buffer translates the input signal from the second signal level used in the second circuit so as to be compatible with signal levels used in the first circuit.

The input buffer contains a signal comparator that compares the voltage level of the input signal with the voltage level of a reference signal, which represents a voltage threshold. The comparator generates an output signal to the first circuit representing either one logical state or the other depending on the difference between the input and reference signals. The output signal is thus output as a translated signal compatible with the first circuit having the same logical state intended by the input signal.

In one preferred embodiment; the input buffer includes a reference voltage generator that generates the reference signal at a level corresponding to a logical threshold or "trip point" voltage level between the high and low voltage states of the second power supply. In particular, the voltage threshold is dynamically self-adjusted in proportion to the second power supply voltage level used in the second circuit.

In another preferred embodiment, the input buffer includes a complementary signal generator that receives the input signal from the second circuit and generates a complement of the input signal as the reference signal to be compared. The input signal and its complement are thus compared in the signal comparator, and an output signal is generated for output to the first circuit representing either one logical state or the other depending on the voltage level of the input signal.

The foregoing and other features and advantages of the invention will become more apparent from the following detailed description of the preferred embodiment of the invention which is provided with reference to the accompanying drawings.

DETAILED DESCRIPTION OF PREFERRED EMBODIMENT

The invention will be described in detail with reference to the preferred embodiments illustrated in FIGS. 1, 2, 3, 4a and 4b. The invention is described herein in its preferred application to an operational circuit which has a dynamic random access memory (DRAM) section operating with a first power supply having a first voltage level (e.g., 2.5 volts) embedded on the same integrated circuit and interfaced with a logic section operating with a second power supply having a second voltage level (e.g., 1.8 volts). However, the invention may be applicable to any type or configuration of computer system or interface between electronic circuits (e.g., static random access memory (SRAM), read only memory (ROM), microprocessor, etc.) which have different power supplies, and typically different voltage operating ranges.

Figure 1:
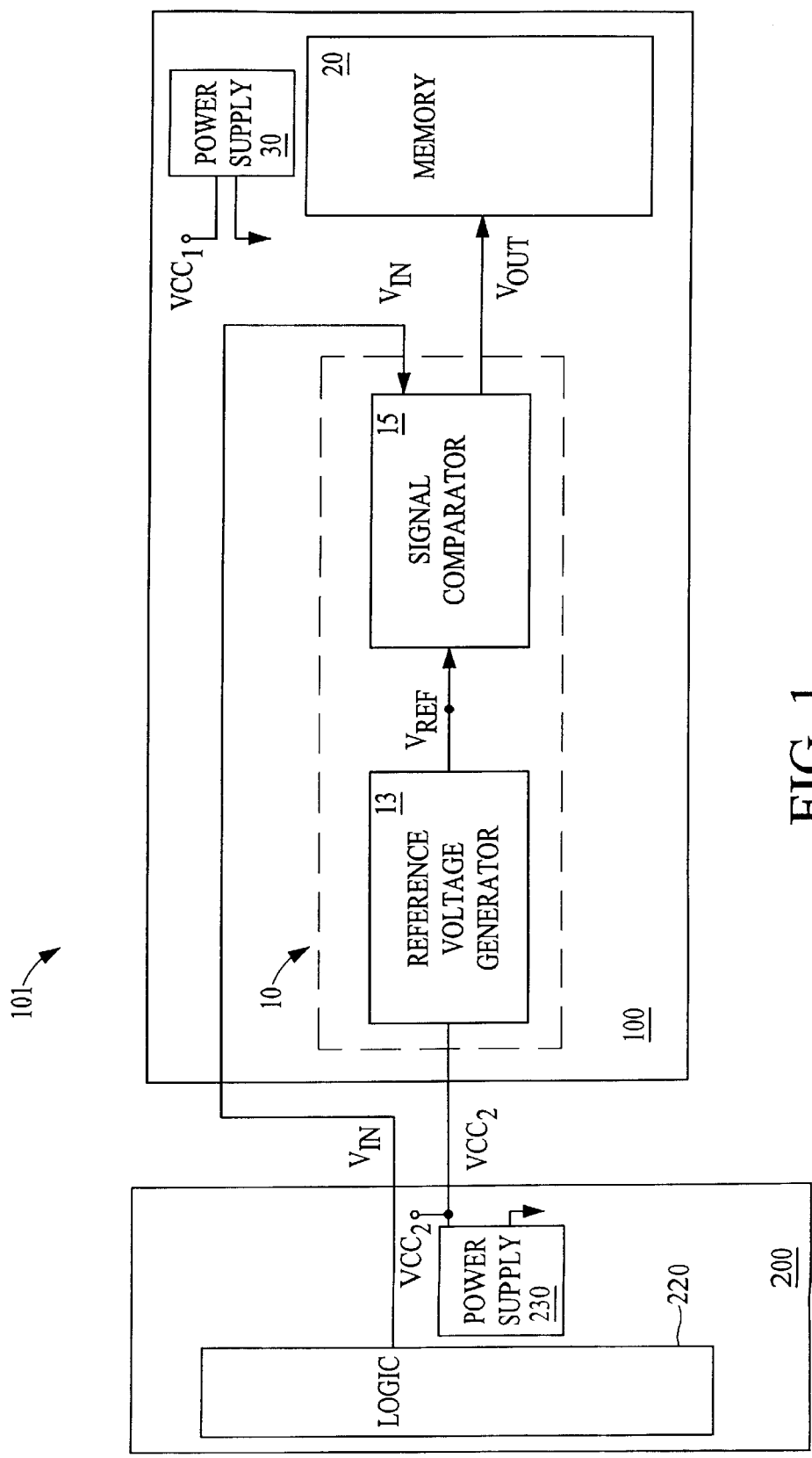
FIG. 1 illustrates in block diagram form a computer system embodying a preferred embodiment of the invention.

FIG. 1 illustrates in block diagram form a preferred embodiment of the invention where a computer system 101 fabricated on a single integrated circuit includes a dynamic random access memory (DRAM) core section 100 interfaced with a logic section 200 containing, for example, combinatorial logic or other electronic devices used to process, transmit and receive data signals to the DRAM core section 100. Both sections 100 and 200 contain independent power supplies 30 and 230, respectively, operating at different power supply voltage levels. In this preferred embodiment, DRAM power supply 30 is operating at 2.5 volts (Vcc1) and allows rail voltages of 2.5 and 0.0 volts (i.e., Vcc1 and ground) within core section 100. The logic power supply 230 is operating at 1.8 volts (Vcc2) and allows voltage swings between 1.8 and 0.0 volts (i.e., between Vcc2 and ground) within logic section 200. It should be noted, however, that the invention is not limited to the specific voltage levels described herein. The power supply levels Vcc1 and Vcc2 may be any two voltage levels without departing from the invention. The "ground" or Vss voltage may be zero or any other voltage lower than Vcc for either power supply 30, 230.

Logic device 220 of logic section 200 outputs data signal VIN having voltage level swings between 0.0 and 1.8 volts. This data signal VIN is received by DRAM core section 100 as an input signal into input buffer 10. In particular, the input signal VIN is received as a first input to signal comparator 15. Signal comparator 15 receives as its second input a voltage reference signal VREF from reference voltage generator 13. An output signal VOUT is produced by signal comparator 15 and input to memory device 20 for use (e.g., storage in memory cells). The voltage reference signal VREF is output by reference voltage generator 13 as a predetermined voltage reference based on the voltage level Vcc2 (e.g., VREF =½(Vcc2)) of the logic power supply 230 used by logic section 200.

In operation, input signal VIN output by logic section 200 is compared in signal comparator 15 to the predetermined voltage reference signal VREF output by reference voltage generator 13. The voltage reference signal VREF represents the voltage "trip point" of the logic signaling "protocol" (i.e., voltage swing between zero volts and Vcc2) used by logic section 200. Thus, when signal comparator 15 determines that input signal VIN is less than (or substantially equal to) reference signal VREF, it will generate an output signal VOUT representing one logical state (e.g., logical "0" state). When signal comparator 15 determines that input signal VIN is greater than reference signal VREF, it will generate an output signal VOUT representing another logical state (e.g., logical "1" state). Preferably, the logical "1" state will be represented by an output voltage VOUT substantially equal to Vcc1, while the logical "0" state will be represented by output voltage VOUT substantially equal to ground or zero volts. As the output signal VOUT alternates between zero volts and the voltage level Vcc1, VOUT adheres to the signaling "protocol" used in the DRAM core section 100. Thus, signal comparator 15 effectively operates as a voltage level translator which translates the voltage level (i.e., 0–Vcc2) of the input signal VIN into one of two voltage levels (i.e., 0 or Vcc1) of output signal VOUT.

As shown in FIG. 1, reference voltage generator 13 detects the voltage level Vcc2 of logic power supply 230. By automatically and continuously monitoring this voltage level Vcc2, reference voltage generator 13 is able to dynamically adjust the "trip point" represented by its voltage reference signal VREF for any voltage level used in logic section 200. That is, as Vcc2 varies, so will VREF (e.g., VREF=M(Vcc2)). This dynamic adjustment compensates for variations inherent in the different logic sections 200 (and their respective power supplies 230) used with DRAM core section 100 in the computer system, and provides versatility for DRAM section 100 to be used with other sections or components operating at the same or different voltage levels.

Reference voltage generator 13 may be a voltage divider, a voltage regulator circuit, or any other circuit or component used to derive a voltage level (VREF) between the lowest and highest voltages supported by power supply 230. Preferably, the voltage level signal VREF derived from Vcc2 is set to be approximately midway between the lowest and highest voltages supported by power supply 230. It should be readily apparent, however, that the voltage level VREF may be set at any predetermined or other proportional relationship to the voltage level of power supply 230 sufficient to delineate a threshold between a high voltage level state and a low voltage level state.

Figure 2:
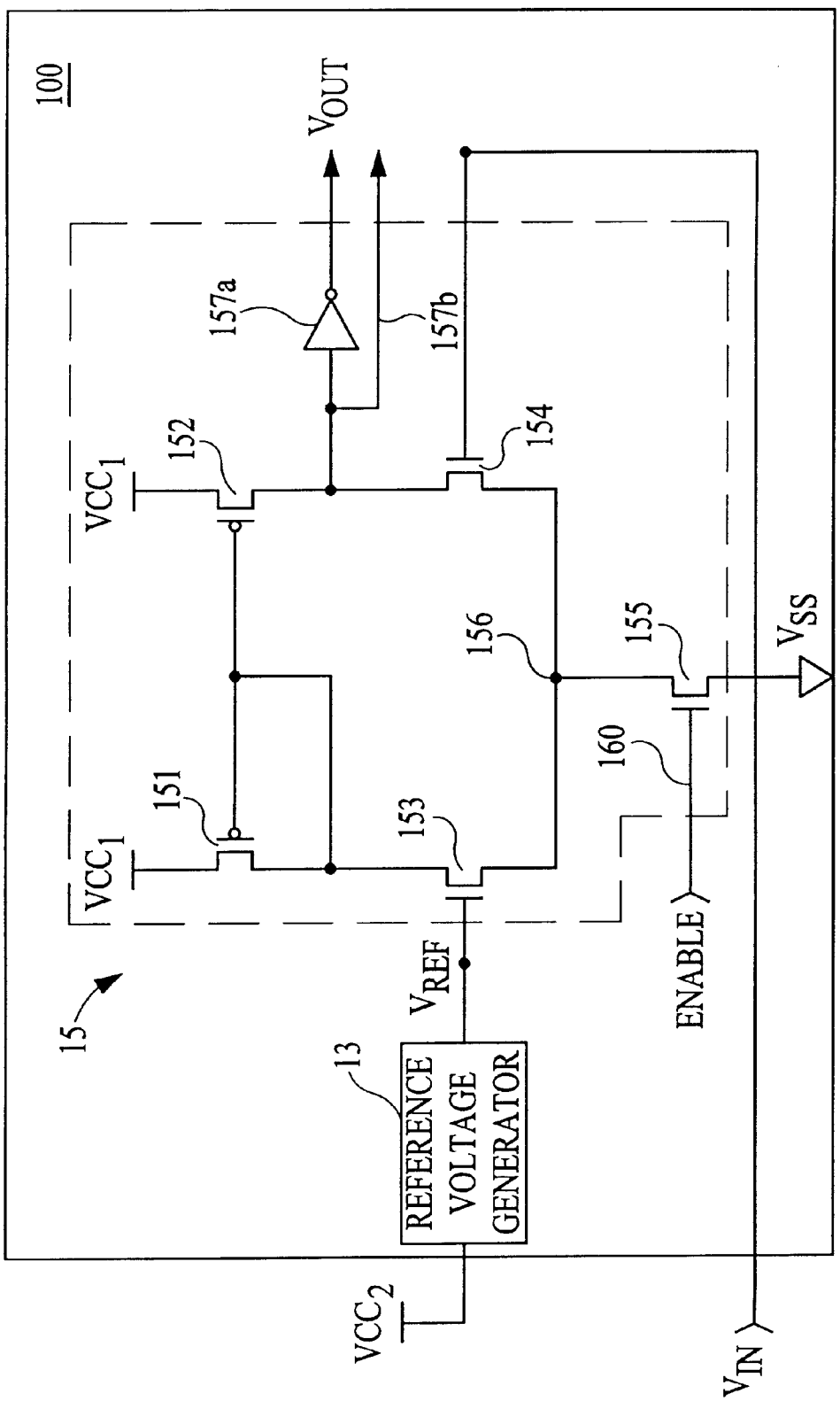
FIG. 2 illustrates a preferred embodiment of the invention employing a signal comparator in the form of a differential amplifier.

Signal comparator 15 is preferably constructed as a differential amplifier, as shown in FIG. 2. It is understood, however, that any one of a variety of known comparators may be used in practicing the invention. As shown in the figure, the differential amplifier contains two complementary pairs of transistors. A first pair is made up of P-channel transistor 151 and N-channel transistor 153 coupled in series between power supply source Vcc1 and node 156. A second pair of transistors formed by P-channel transistor 152 and N-channel transistor 154 are coupled in series between power supply source Vcc1 and node 156, as well. The voltage reference signal VREF from reference voltage generator 13 controls the gate input of N-channel transistor 153. The drains of transistors 151 and 153 are coupled together and are also coupled to the gates of transistors 151 and 152. The input voltage signal VIN from logic section 200 controls the gate input of N-channel transistor 154. The drains of transistors 152 and 154 are coupled together and provide the translated output signal VOUT directly (157b), or through inverter 157a. An N-channel transistor 155 is coupled between node 156 and Vss, which is shown as a ground potential. The gate of transistor 155 is tied to an enable signal input line 160. This enable signal is preferably received from a controller (not shown) on-board the DRAM core section 100, but may also be received from an off-chip controller external to DRAM core section 100. The enable signal is used to control whether or not the FIG. 2 circuit is operational. Thus, the FIG. 2 circuit may be disabled during a power-down operation.

As noted above with respect to signal comparator 15, the operation of the differential amplifier shown in FIG. 2 is controlled by the voltage levels of input signal VIN and voltage reference signal VREF. Whenever VIN is less than the ("trip point") value of VREF, output signal VOUT transitions to one logical state, and when VIN is greater than VREF, VOUT transitions to the other logical state. Because reference voltage generator 13 outputs voltage reference signal VREF as a direct relationship to the voltage level Vcc2 of logic power supply 230, the "trip point" of the voltage level used in logic section 200 can be automatically self-adjusted to compensate for any variation in the voltage level of power supply 230.

Figure 3:
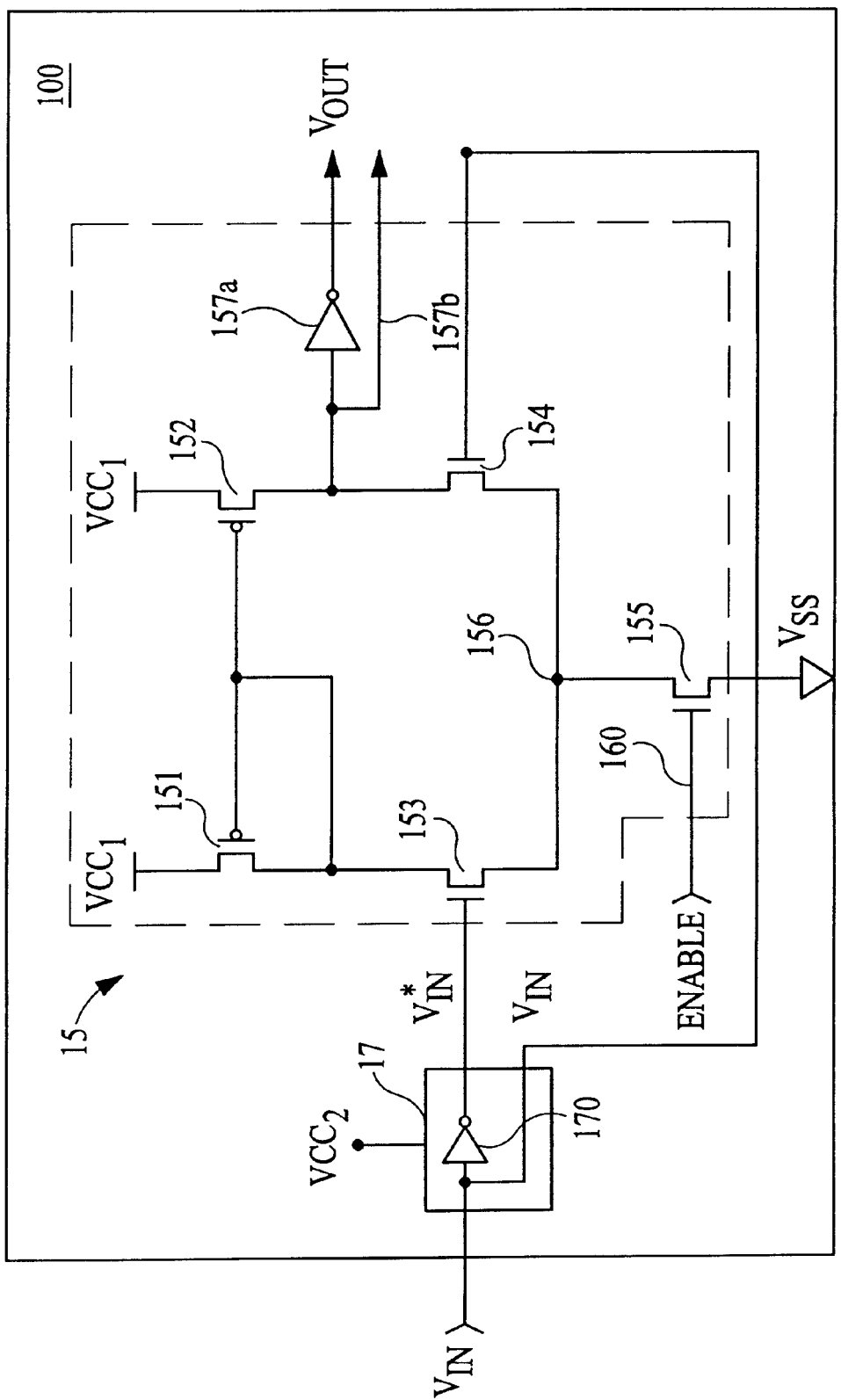
FIG. 3 illustrates a preferred embodiment of the invention employing a complementary signal generator.

In another preferred embodiment, reference voltage generator 13 (FIG. 2) is replaced with a complementary signal generator 17, as shown in FIG. 3. Complementary signal generator 17 is powered by the same power supply voltage Vcc2 used in logic section 200, but does not output a derived voltage level signal VREF, as in the first preferred embodiment. Instead, complementary signal generator 17 receives input signal VIN from logic section 200 and generates its complement VIN* as the voltage reference signal. Preferably, complementary signal generator 17 will also regenerate input signal VIN as regenerated input signal VIN'. The regenerated VIN- signal output from complementary signal generator 17 is substantially the same, at least in voltage level, as the input signal VIN and is used to control the gate input of N-channel transistor 154, in a manner similar to that described in the previous embodiment. Its complement, VIN*, however, is output from complementary signal generator 17 to control the gate of N-channel transistor 153. The regenerated VIN signal input to transistor 154 and its complement VIN* input to transistor 153 are thus compared in the signal comparator 15, and an output signal VOUT is generated representing either one logical state or the other depending on the voltage level of the VIN signal.

Complementary signal generator 17 may be implemented using inverter 170, as shown in FIG. 3, or any known component or circuit capable of inputting a signal and regenerating the same or substantially the same signal and its complement. The complementary signal generator may regenerate the input signal optionally applying a delay to match any inherent delay in the inverter (or like circuit), or simply allow the signal comparator to utilize the input signal VIN directly from logic section 200.

While the invention has been described in detail in connection with the best mode of the invention currently known, it should be readily understood that the invention is not limited to the specified embodiment described herein. Rather, the invention can be modified to incorporate any number of variations, alterations, substitutions or equivalent arrangements not heretofore described, which are commensurate with the spirit and scope of the invention. For example, Vcc2 may operate at any voltage level such as 1.8 volts, 2.5 volts, 3.3 volts, etc., whether or not Vcc1 is operating at the same or different voltage such as 2.5 volts.

Figure 4A:
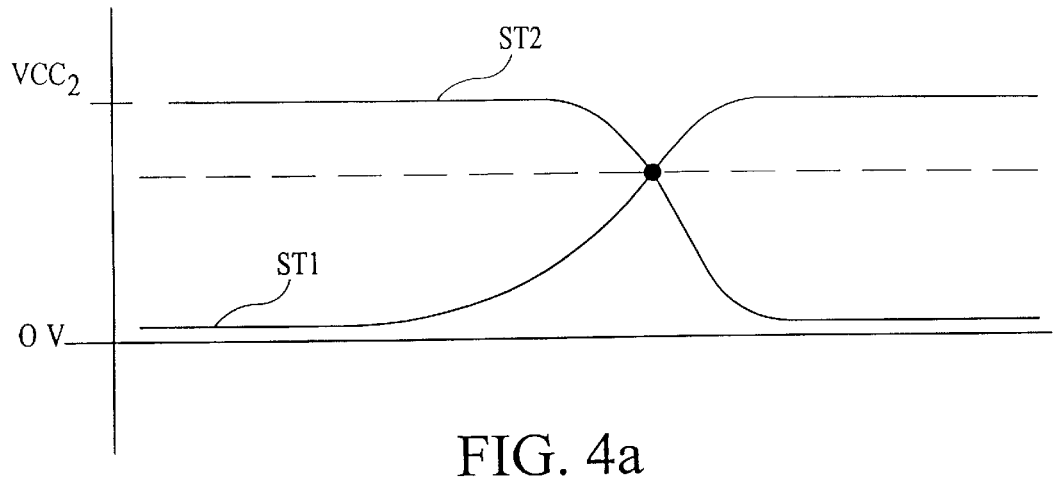
FIG. 4a illustrates the typical skew problem of a receiving circuit that has a trip point closer to either the high or the low voltage state of the transmitting circuit.

One of the many advantages of the invention is the elimination of the skew between signals (ST1) transitioning from LOW to HIGH states and those signals (ST2) transitioning from HIGH to LOW states found in known input buffers, as shown in FIG. 4a. The typical skew problem arises from a trip point of the receiving circuit that is closer to either the high or the low voltage state of the transmitting circuit. Where the high voltage state is closer to the trip point, for example, as shown in FIG. 4a, the falling edge transition time will be shorter than the rising edge transition time, thereby resulting in the skew problem.

Figure 4B:
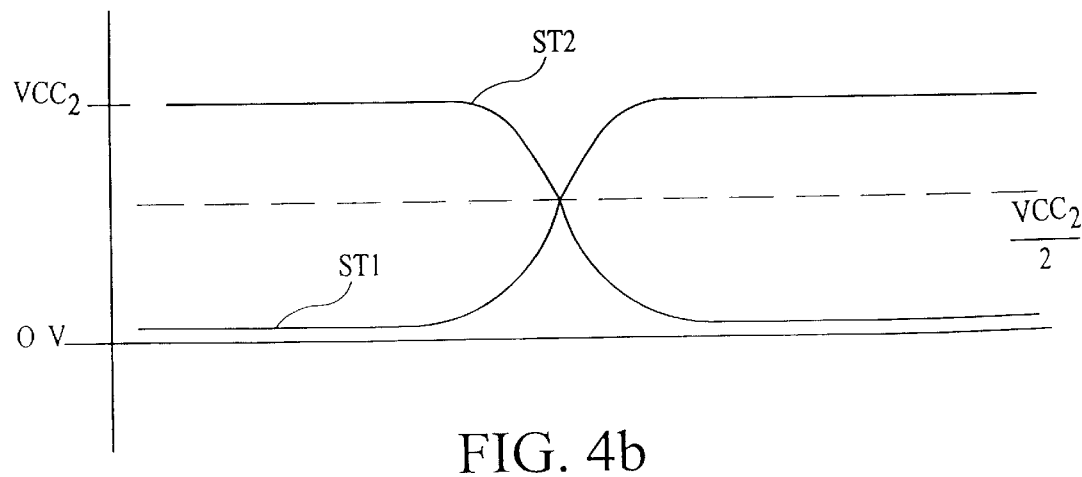
FIG. 4b illustrates the elimination of the skew problem when the receiving circuit embodies the invention.

As a result of the invention, however, the trip point can be adjusted to a point approximately midway between the LOW (0 V) and HIGH (Vcc2 V) voltage levels, as shown in FIG. 4b, thereby eliminating the skew between transition signals ST1 and ST2.

Accordingly, the invention is not limited by the foregoing description, but is only limited by the scope of the appended claims.

What is claimed as new and desired to be protected by letters patent of the united states is:

1. A method of translating data signals for use in an integrated circuit having a logic section and a memory section, the method comprising the steps of:
   inputting a data signal and a first power supply voltage level signal from the logic section;
   deriving a reference voltage signal in the memory section from the first power supply voltage level signal in the logic section;
   comparing the data signal and the reference voltage signal, and generating a translated data signal representing one of two possible states depending on a comparison between the data signal and the reference voltage signal; and
   storing in a memory device of the memory section the translated data signal generated in said comparing step.

2. A method of translating data signals as recited in claim 1, wherein said comparing step is performed using a differential amplifier.

3. A method of translating data signals as recited in claim 2, wherein said deriving step comprises the step of voltage dividing the first power supply voltage level signal by approximately one-half.

4. A method of translating data signals as recited in claim 1, wherein said storing step comprises the step of storing the translated data signal in a dynamic random access memory (DRAM) device on the memory device.

5. A method of translating data signals as recited in claim 1, wherein said storing step comprises the step of storing the translated data signal in a static random access memory (SRAM) device.

6. A method of translating data signals as recited in claim 4, wherein said comparing step comprises the step of generating a translated data signal having a voltage level substantially equal to a high state of a second power supply when the data signal is above the reference voltage signal and a voltage level substantially equal to a low state when the data signal is equal to or below the reference voltage signal.

7. A method of translating data signals as recited in claim 6, wherein the first power supply voltage level signal is output from a logic power supply in the logic section, and the second power supply voltage level is output from a memory power supply in the memory section.

8. A method of transmitting data signals in an integrated computer system having a logic section and a memory core section, the method of transmitting data comprising the steps of:

outputting from the logic section a data signal that has voltage swings between ground and a voltage level of a logic power supply;

automatically monitoring at the memory core section the voltage level of the logic power supply;

generating a reference voltage signal representative of a voltage proportional to the monitored voltage level of the logic power supply;

determining a difference between the reference voltage signal and the data signal output in said outputting step;

producing an output voltage signal at the memory core section at a voltage level substantially equal to ground or a voltage level of a core power supply of the memory core section in response to the difference between the reference voltage signal generated in said generating step and the data signal output in said outputting step; and storing in a random access memory of the memory core section the output voltage signal produced by said producing step.

9. A method of transmitting data signals as recited in claim 8, further comprising the step of operating the logic power supply at 3.3 volts and the core supply at 2.5 volts.

10. A method of transmitting data signals as recited in claim 8, wherein said storing step further comprises the step of storing the output voltage produced by said producing step in a dynamic (DRAM) random access memory device.

11. A method of transmitting data signals as recited in claim 8, wherein said storing step further comprises the step of storing the output voltage produced by said producing step in a static random access memory (SRAM) device.

12. A method of transmitting data signals as recited in claim 8, wherein said outputting step is performed using a logic section comprising a microprocessor.

* * * * *

UNITED STATES PATENT AND TRADEMARK OFFICE
CERTIFICATE OF CORRECTION

PATENT NO. : 6,205,078 B1
DATED : March 20, 2001
INVENTOR(S) : Todd A. Merritt

Page 1 of 1

It is certified that error appears in the above-identified patent and that said Letters Patent is hereby corrected as shown below:

Column 2,
Lines 23-24, reads "4,306,801" should read -- 4,806,801 --;

Column 5,
Line 58, reads "VIN'." should read -- VIN-. --

Signed and Sealed this

Twenty-ninth Day of January, 2002

Attest:

JAMES E. ROGAN
Attesting Officer
Director of the United States Patent and Trademark Office